(12) United States Patent
Yamanishi et al.

(10) Patent No.: US 8,441,278 B2
(45) Date of Patent: May 14, 2013

(54) STACKED SEMICONDUCTOR DEVICE AND METHOD OF CONNECTION TEST IN THE SAME

(75) Inventors: Norio Yamanishi, Nagano (JP); Shinobu Kurosaka, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 233 days.

(21) Appl. No.: 12/882,615

(22) Filed: Sep. 15, 2010

(65) Prior Publication Data

US 2011/0074438 A1   Mar. 31, 2011

(30) Foreign Application Priority Data

Sep. 29, 2009   (JP) ................................. 2009-223774

(51) Int. Cl.
*G01R 31/02*   (2006.01)

(52) U.S. Cl.
USPC . 324/762.01; 324/537; 324/500; 324/762.02; 324/762.07; 324/762.08; 257/777; 257/723; 257/686; 438/107

(58) Field of Classification Search .................. 324/537, 324/538, 762.01–762.09; 257/777, 723, 686; 438/107
See application file for complete search history.

(56) References Cited

U.S. PATENT DOCUMENTS

2006/0132996 A1* 6/2006 Poulton ........................... 361/56

FOREIGN PATENT DOCUMENTS

| JP | 2001-13215 | | 1/2001 |
| JP | 2001013215 A | * | 1/2001 |

* cited by examiner

*Primary Examiner* — Jermele M Hollington
*Assistant Examiner* — Son Le
(74) *Attorney, Agent, or Firm* — Kratz, Quintos & Hanson, LLP (57) ABSTRACT

A stacked semiconductor device includes a first semiconductor device equipped with a first semiconductor chip 14 having a transistor circuit and protection diodes, and a second semiconductor device equipped with a second semiconductor chip 24 having a transistor circuit and protection diodes, and stacked on the first semiconductor device via a connection portion, wherein a power supply line connected to the first and second semiconductor chips is used in common, and a forward ON voltage of the protection diodes of the first semiconductor chip is set higher than a forward ON voltage of the protection diodes of the second semiconductor chip 24. When a connection test is executed, the forward ON voltage of the protection diodes of the first semiconductor chip or the second semiconductor chip is detected and then normal/open is judged.

6 Claims, 4 Drawing Sheets

FIG. 3B forward ON voltage of the protection diode D1, D2 of the first semiconductor chip 14 > forward ON voltage of the protection diode D1, D2 of the second semiconductor chip 24

FIG. 4 forward ON voltage of
the protection diode D1,
D2 of the first
semiconductor chip 14

> forward ON voltage of
the protection diode D1,
D2 of the second
semiconductor chip 24

STACKED SEMICONDUCTOR DEVICE AND METHOD OF CONNECTION TEST IN THE SAME

CROSS-REFERENCE TO RELATED APPLICATIONS

This application is based on and claims priority of Japanese Patent Application No. 2009-223774 filed on Sep. 29, 2009, the entire contents of which are incorporated herein by reference.

BACKGROUND OF THE INVENTION

1. Field of the Invention

The present invention relates to a stacked semiconductor device and a method of a connection test in the same, more particularly, a stacked semiconductor device in which a second semiconductor device including a second semiconductor chip is stacked on a first semiconductor device including a first semiconductor chip and then connected thereto via connection portions and a method of a connection test in the same.

2. Description of the Related Art

In the prior art, there is the stacked semiconductor device in which the second semiconductor device is stacked on the first semiconductor device and is connected electrically thereto via the bump electrodes. The stacked semiconductor device is also called the package on package (PoP) because the package in which the semiconductor chip is mounted is stacked.

In such stacked semiconductor device, in order to reject a product in which a connection fault occurs prior to a shipment, a connection test of the connection portions between the first semiconductor device and the second semiconductor device is performed.

In Patent Literature 1 (Patent Application Publication (KO-KAI) 2001-13215), it is set forth that, in the stacked package having the LSI chips, an open/short test between terminals of respective LSI chips and external terminals is performed by measuring the characteristics of the protection diode in the LSI chip.

As explained in the column of the related art described later, in the case that the connection test in the stacked semiconductor device is performed by detecting the forward ON voltage of the protection diode in the semiconductor chip, such a problem exists in some cases that, when the power supply lines are used in common, it is not always detected precisely whether the connection portions are normal or open.

SUMMARY OF THE INVENTION

It is an object of the present invention to provide a stacked semiconductor device capable of performing a connection test precisely even when the power supply lines of a first semiconductor device and a second semiconductor device in a stacked state are used in common, and a method of a connection test in the same.

The present invention is concerned with a stacked semiconductor device, which includes a first semiconductor device including a signal line, a power supply line, a ground line, and a first semiconductor chip having a transistor circuit connected to the signal line, a first protection diode connected between the signal line and the power supply line, and a second protection diode connected between the signal line and the ground line; and a second semiconductor device including a signal line, a power supply line, a ground line, and a second semiconductor chip having a transistor circuit connected to the signal line, a first protection diode connected between the signal line and the power supply line, and a second protection diode connected between the signal line and the ground line, wherein the second semiconductor device is stacked on the first semiconductor device via a connection portion such that each of the signal line, the power supply line, and the ground line is connected respectively, wherein the power supply line connected to the first and second semiconductor chips is used in common, and a forward ON voltage of the first and second protection diodes of the first semiconductor chip is set higher than a forward ON voltage of the first and second protection diodes of the second semiconductor chip.

In the stacked semiconductor device of the present invention, the second semiconductor device including the second semiconductor chip is stacked on the first semiconductor device including the first semiconductor chip and is connected electrically thereto via the connection portions. Then, when the connection test of the connection portions is performed, it is judged whether the electrical connection is normal or open, by detecting the forward ON voltage of the protection diode in the semiconductor chip.

At this time, as explained in the related art described later, in the case that the power supply lines connected to the first semiconductor chip and the second semiconductor chip are used in common, and the forward ON voltage of the first semiconductor chip is equal to or lower than that of the second semiconductor chip, it cannot be detected precisely whether the electrical connection of the connection portions is normal or open.

Therefore, in the present invention, the forward ON voltage of the protection diode of the first semiconductor chip is set higher than the forward ON voltage of the protection diode of the second semiconductor chip.

Accordingly, when the connection test is performed, a constant electric current is supplied from the signal line to the power supply line, and then when the electrical connection of the connection portion of the signal line is normal, the forward ON voltage (the one where the voltage is lower) of the first protection diode of the second semiconductor chip is detected.

Otherwise, when the electrical connection of the connection portion is open, the forward ON voltage of the first protection diode of the first semiconductor chip (the one where the voltage is higher) is detected.

In this manner, on the occasion that the connection test of the connection portion is performed, when it is judged whether the electrical connection is normal or open, the different forward ON voltage of the protection diode is detected. As a result, the connection test can be performed precisely.

Otherwise, in the case that the connection portion is electrically short with other connection portion, the voltage of 0 V is detected. In addition to normal or open, an occurrence of electrical short circuit can be detected precisely.

As explained above, in the present invention, even when power supply lines of the first semiconductor device and the second semiconductor device in a stacked state are used in common, the connection test can be performed precisely.

DETAILED DESCRIPTION OF THE PREFERRED EMBODIMENT

An embodiment of the present invention will be explained with reference to the accompanying drawings hereinafter.

Related Art

Prior to the explanation of an embodiment of the present invention, the related art which is associated with the present invention will be explained hereunder. FIGS. 1A, 1B and FIGS. 2A, 2B are views to explain first and second stacked semiconductor devices and a method of a connection test thereof in the related art.

Figure 1A:
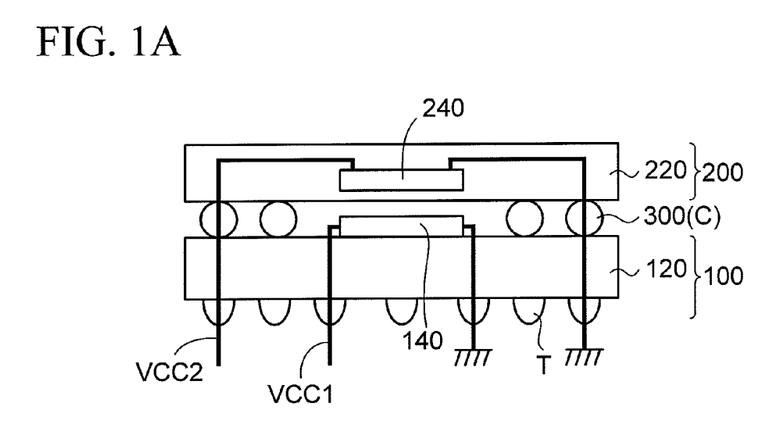
FIG. 1A is a sectional view showing a first stacked semiconductor device in the related art.

As shown in FIG. 1A, the first stacked semiconductor device in the related art is constructed basically such that a second semiconductor device 200 is stacked on a first semiconductor device 100. In the first semiconductor device 100, a first semiconductor chip 140 is mounted on a first wiring substrate 120, and terminals T are provided on the lower surface of the first wiring substrate 120.

Also, in the second semiconductor device 200, a second semiconductor chip 240 is built in a second wiring substrate 220. The second wiring substrate 220 is connected electrically to the first wiring substrate 120 via connection terminals 300 (connection portions C) which is located to a lower side.

In the first stacked semiconductor device in the related art, a power supply line is provided independently to the first semiconductor device 100 and the second semiconductor device 200 respectively. In the first semiconductor device 100, a power is supplied to the first semiconductor chip 140 from a first power supply line VCC1. On the other hand, in the second semiconductor device 200, a power is supplied to the second semiconductor chip 240 from a second power supply line VCC2.

Next, an equivalent circuit of the stacked semiconductor device in which the power supply lines are provided independently as described above will be explained hereunder.

Figure 1B:
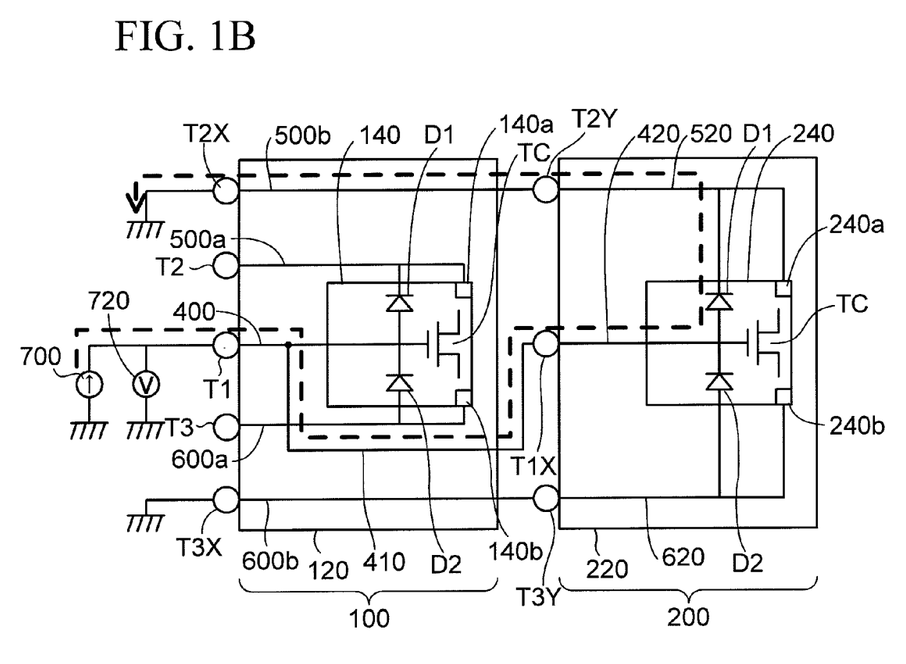
FIG. 1B is a view showing an equivalent circuit to explain a method of a connection test in the first stacked semiconductor device in the related art.

As shown in FIG. 1B, a transistor circuit TC (internal circuit) and two first and second protection diodes D1, D2 connected to the transistor circuit TC are built in the first semiconductor chip 140 of the first semiconductor device 100. A signal line 400 in the first wiring substrate 120 is connected to the transistor circuit TC of the first semiconductor chip 140, and a signal terminal T1 connected to the signal line 400 is provided on the lower surface of the first wiring substrate 120. In the following, in FIG. 1B, respective terminals are depicted to the left side of the wiring substrate.

A first power supply line 500a in the first wiring substrate 120 is connected to a power supply pad 140a of the first semiconductor chip 140, and a first power supply terminal T2 connected to the first power supply line 500a is provided on the lower surface of the first wiring substrate 120. Also, a first ground line 600a in the first wiring substrate 120 is connected to a ground pad 140b of the first semiconductor chip 140, and a first ground terminal T3 connected to the first ground line 600a is provided on the lower surface of the first wiring substrate 120.

Also, the first protection diode D1 described above is connected between the signal line 400 and the first power supply line 500a. Also, the second protection diode D2 described above is connected between the signal line 400 and the first ground line 600a.

When a plus (+) overvoltage is supplied to the signal line 400 due to the influence of static electricity, a forward bias is supplied to the first protection diode D1 connected to the first power supply line 500a, and thus the static electricity is discharged to the first power supply terminal T2. Also, when a minus (−) overvoltage is supplied to the signal line 400, a forward bias is supplied to the second protection diode D2, and thus the static electricity is discharged to the first ground terminal T3.

In this manner, on account of the functions of the first and second protection diodes D1, D2, the transistor circuit TC of the first semiconductor chip 140 can be protected from the breakdown caused due to a high voltage.

Also, in the second semiconductor device 200, similarly the transistor circuit TC (internal circuit) and two the first and second protection diodes D1, D2 connected to the transistor circuit TC are built in the second semiconductor chip 240.

A signal line 420 in the second wiring substrate 220 is connected to the transistor circuit TC, and a signal terminal T1X connected to the signal line 420 is provided on the lower surface of the second wiring substrate 220. The signal terminal T1X of the second wiring substrate 220 is connected to a branch signal line 410 which is branched from the signal line 400 in the first wiring substrate 120.

Accordingly, the signal terminal T1 of the first semiconductor device 100 is connected to the transistor circuit TC of the second semiconductor chip 240 via the signal line 400 and the branch signal line 410 of the first wiring substrate 120 and the signal terminal T1X and the signal line 420 of the second wiring substrate 220.

A power supply line 520 in the second wiring substrate 220 is connected to a power supply pad 240a of the second semiconductor chip 240, and a power supply terminal T2Y connected to the power supply line 520 is provided on the lower surface of the second wiring substrate 220.

The power supply terminal T2Y of the second wiring substrate 220 is connected to a second power supply line 500b in the first wiring substrate 120, and a second power supply terminal T2X connected to the second power supply line 500b is provided on the lower surface of the first wiring substrate 120. Also, the first protection diode D1 of the second semiconductor chip 240 is connected between the signal line 420 and the power supply line 520 of the second wiring substrate 220.

Also, a ground line 620 in the second wiring substrate 220 is connected to a ground pad 240b of the second semiconductor chip 240, and a ground terminal T3Y connected to the ground line 620 is provided on the lower surface of the second wiring substrate 220. The ground terminal T3Y of the second wiring substrate 220 is connected to a second ground line 600b of the first wiring substrate 120, and a second ground terminal T3X connected to the second ground line 600b is provided on the lower surface of the first wiring substrate 120.

Also, the second protection diode D2 of the second semiconductor chip 240 is connected between the signal line 420 and the ground line 620 of the second wiring substrate 220.

In the second semiconductor chip 240, similarly, on account of the functions of the first and second protection diodes D1, D2, the transistor circuit TC of the second semiconductor chip 240 can be protected from the breakdown caused due to a high voltage.

Next, a method of performing a connection test of the connection portions of the first stacked semiconductor device in FIG. 1B will be explained hereunder.

As also shown in FIG. 1B, first, an open/short tester (not shown) equipped with a constant-current source 700 and a voltmeter 720 is prepared. Then, the constant-current source 700 and the voltmeter 720 are connected to the signal terminal T1 provided to the first wiring substrate 120.

Then, a constant electric current of 100 μA is supplied to the signal line 400 from the constant-current source 700. At this time, the constant electric current flows from the signal terminal T1X to the signal line 420 of the second wiring substrate 220 via the signal line 400 and the branch signal line 410 of the first wiring substrate 120 (see a route indicated with a broken line). Since the first power supply line 500a of the first wiring substrate 120 is not grounded, the constant electric current flows toward only the branch signal line 410 side branched from the signal line 400.

Also, the constant electric current flows toward the first protection diode D1 in the second semiconductor chip 240, the power supply line 520 and the power supply terminal T2Y of the second wiring substrate 220 (see a route indicated with a broken line). Then, the constant electric current flows toward the second power supply line 500b and the second power supply terminal T2X of the first wiring substrate 120 (see a route indicated with a broken line).

Since the second power supply terminal T2X of the first wiring substrate 120 is grounded, the constant electric current supplied to the signal terminal T1 of the first wiring substrate 120 flows toward the second power supply terminal T2X of the first wiring substrate 120 via the above electrical routes (see the routes indicated with a broken line).

Here, when the conduction of the above electrical routes is normal, a forward ON voltage (0.45 V) of the first protection diode D1 of the second semiconductor chip 240 can be detected from the voltmeter 720.

As a result, such a condition can be checked that the electrical connection between the signal terminal T1X of the second wiring substrate 220 and the first wiring substrate 120 is normal. Since the connection between the power supply terminal T2Y of the second wiring substrate 220 and the first wiring substrate 120 is contained in the above electrical routes, such a condition can be checked simultaneously that the electrical connection of the power supply terminal T2Y of the second wiring substrate 220 is also normal.

In the case that the electrical connection between the signal terminal T1X of the second wiring substrate 220 and the first wiring substrate 120 is open, the constant electric current does not flow and therefore the voltage indication of the voltmeter 720 shows an infinite voltage. Also, in the case that the signal terminal T1X of the second wiring substrate 220 is electrically short with other terminal, 0 V can be detected from the voltmeter 720.

As described above, in the case that the power supply lines of the first semiconductor device 100 and the second semiconductor device 200 are provided independently, all cases of such a condition can be detected precisely that the electrical connection of the connection portions between the first semiconductor device 100 and the second semiconductor device 200 is normal, open, or electrical short, based on the detected value of the forward ON voltage of the first protection diode D1.

Figure 2A:
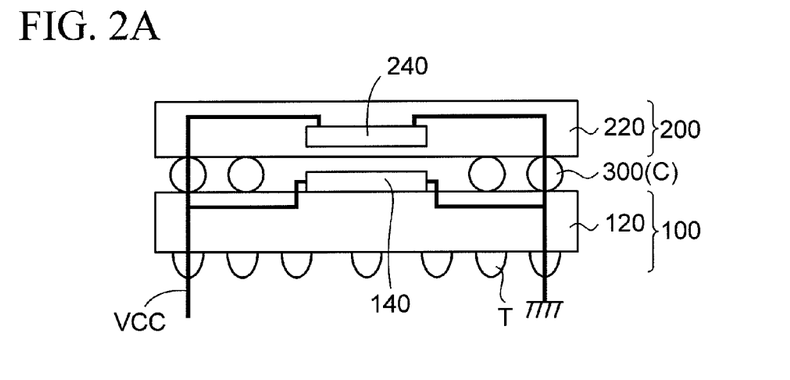
FIG. 2A is a sectional view showing a second stacked semiconductor device in the related art.

Next, the second stacked semiconductor device in the related art will be explained hereunder. As shown in FIG. 2A, in the second stacked semiconductor device in the related art, a power supply line VCC is used in common. That is, a power is supplied to both the first semiconductor chip 140 of the first semiconductor device 100 and the second semiconductor chip 240 of the second semiconductor device 200 from the common (identical) power supply line VCC.

Figure 2B:
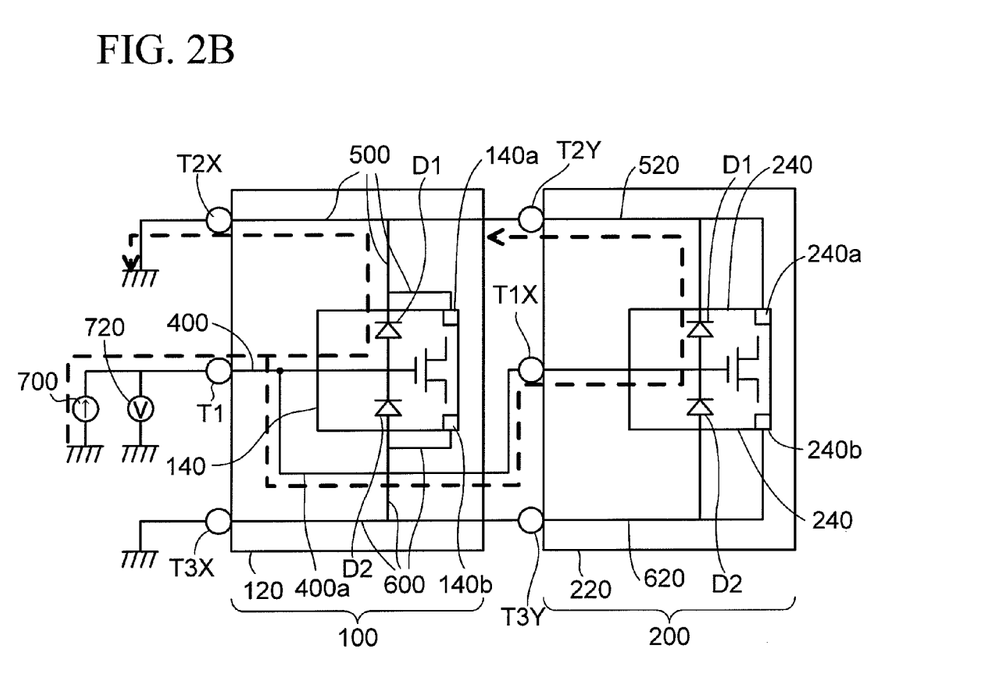
FIG. 2B is a view showing an equivalent circuit to explain a method of a connection test in the second stacked semiconductor device in the related art.

As shown in FIG. 2B, a difference from the equivalent circuit in FIG. 1B described above is that, in FIG. 1B described above, the first power supply line 500a of the first wiring substrate 120 is connected to the second power supply line 500b, and a power supply line 500 (FIG. 2B) as one route is provided to the first wiring substrate 120. Also, the first protection diode D1 of the first semiconductor chip 140 is connected between the signal line 400 and the power supply line 500.

In addition, in FIG. 1B described above, the first ground line 600a of the first wiring substrate 120 is connected to the second ground line 600b, and a ground line 600 (FIG. 2B) as one route is provided to the first wiring substrate 120. Also, the second protection diode D2 of the first semiconductor chip 140 is connected between the signal line 400 and the ground line 600.

The equivalent circuit of the second semiconductor device 200 in FIG. 2B is constructed in the identical way to that in FIG. 1B. That is, the power supply line 500 of the first wiring substrate 120 is connected to the power supply line 520 of the second wiring substrate 220, and the ground line 600 of the first wiring substrate 120 is connected to the ground line 620 of the second wiring substrate 220.

In this manner, in the first semiconductor device 100 and the second semiconductor device 200, the power supply lines 500, 520 and the ground lines 600, 620 are used in common.

Next, a method of a connection test in the connection portions of the second stacked semiconductor device in which the power supply lines are used in common will be explained hereunder.

As shown in FIG. 2B, like FIG. 1B described above, the constant-current source 700 and the voltmeter 720 of the open/short tester are connected to the signal terminal T1 of the first wiring substrate 120. Then, the constant electric current of 100 μA is supplied to the signal line 400 of the first wiring substrate 120 from the constant-current source 700.

At this time, since the power supply lines 500, 520 are used in common in the first semiconductor device 100 and the second semiconductor device 200, the constant electric current flows toward not only the first protection diode D1 of the second semiconductor chip 240 but also the first protection diode D1 of the first semiconductor chip 140. The forward ON voltage of the first and second protection diodes D1, D2 of the first semiconductor chip 140 are set to the identical value (e.g., 0.45 V) with the forward ON voltage of the first and second protection diodes D1, D2 of the second semiconductor chip 240.

Consequently, even when the electrical connection between the signal terminal T1X of the second wiring substrate 220 and the first wiring substrate 120 becomes open, such a situation is caused that an electric current flows through the first protection diode D1 of the first semiconductor chip 140 and thus the forward ON voltage (0.45 V) can be detected from the voltmeter 720.

In this manner, even when the electrical connection between the signal terminal T1X of the second wiring substrate 220 and the first wiring substrate 120 is either normal or open, 0.45 V can be detected from the voltmeter 720. Therefore, it is unfeasible to perform the precise connection test.

Also, in the case that the forward ON voltage of the first and second protection diodes D1, D2 of the first semiconductor chip 140 is lower than the forward ON voltage of the first and second protection diodes D1, D2 of the second semiconductor chip 240, it is unfeasible to perform the precise connection test. This is because, even when the electrical connection is either normal or open, the forward ON voltage of the first protection diode D1 of the first semiconductor chip 140 can be detected in the very first.

In this manner, in the case that the forward ON voltage of the first and second protection diodes D1, D2 of the first semiconductor chip 140 is lower than or equal to the forward ON voltage of the first and second protection diodes D1, D2 of the second semiconductor chip 240, there exists such a problem that it is impossible to detect precisely whether the electrical connection is either normal or open.

In this event, in the case that the signal terminal T1X of the second wiring substrate 220 is electrically short with other terminal, 0 V can be detected from the voltmeter 720. Therefore, it is possible to detect that the above electrical connection is electrically short.

As the result of inventor's earnest study made in view of the above problems, the inventor of this application found that, in the case that the power supply lines of the first semiconductor device 100 and the second semiconductor device 200 are used in common, the forward ON voltage of the first and second protection diodes D1, D2 of the first semiconductor chip 140 should be set higher than the forward ON voltage of the first and second protection diodes D1, D2 of the second semiconductor chip 240.

Embodiment

Figure 3A:
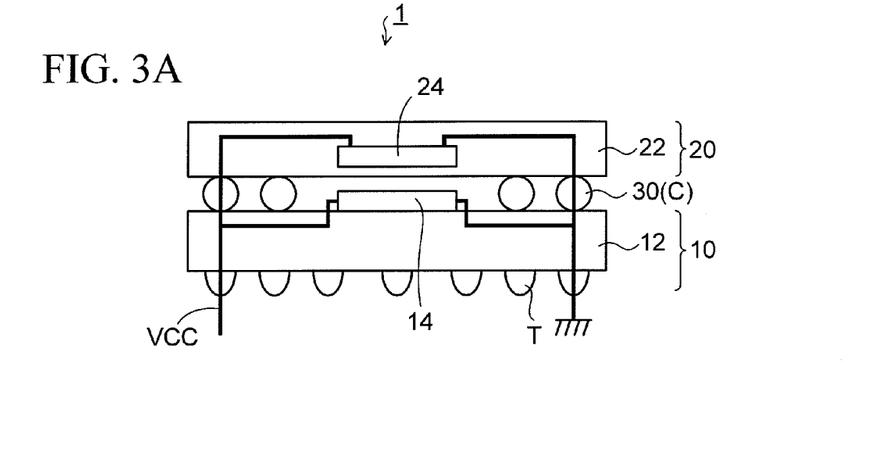
FIG. 3A is a sectional view showing a stacked semiconductor device according to an embodiment of the present invention.
Figure 3B:
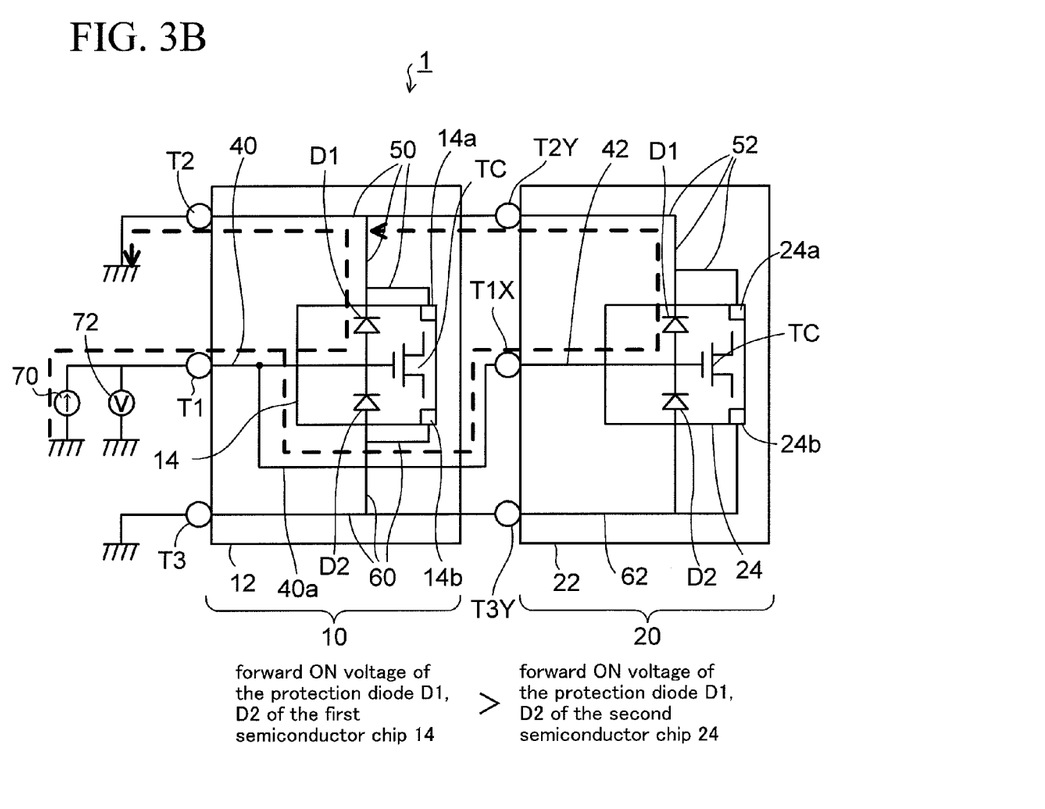
FIG. 3B is a view (#1) showing an equivalent circuit to explain a method of a connection test in the stacked semiconductor device according to the embodiment of the present invention.

FIGS. 3A and 3B are views to explain a stacked semiconductor device and a method of a connection test thereof according to the embodiment of the present invention. As shown in FIG. 3A, a stacked semiconductor device 1 of the embodiment of the present invention is constructed basically such that a second semiconductor device 20 is stacked on a first semiconductor device 10. In the first semiconductor device 10, a first semiconductor chip 14 is mounted on a first wiring substrate 12, and also the terminals T are provided on the lower surface of the first wiring substrate 12.

In the second semiconductor device 20, a second semiconductor chip 24 is built in a second wiring substrate 22, and also the second wiring substrate 22 is connected electrically to the first wiring substrate 12 via connection terminals 30 (connection portions C).

The first semiconductor chip 14 and the second semiconductor chip 24 may be flip-chip mounted or may be connected to the first wiring substrate 12 by the bonding wires. Also, a plurality of semiconductor chips may be mounted or built in the first and second wiring substrates 12, 22, or the passive element such as the capacitor, or the like may be contained in the first and second wiring substrates 12, 22.

In the first semiconductor device 10 and the second semiconductor device 20, the power supply line VCC is used in common and is provided. That is, a power is supplied to the first semiconductor chip 14 of the first semiconductor device 10 and the second semiconductor chip 24 of the second semiconductor device 20 from the common (identical) power supply line VCC.

Next, an equivalent circuit of the stacked semiconductor device 1 of the present embodiment will be explained hereunder. As shown in FIG. 3B, the transistor circuit TC (internal circuit) and two the first and second protection diodes D1, D2 connected to the transistor circuit TC are built in the first semiconductor chip 14 mounted on the first wiring substrates 12.

A signal line 40 in the first wiring substrate 12 is connected to the transistor circuit TC of the first semiconductor chip 14, and then the signal terminal T1 connected to the signal line 40 is provided on the lower surface of the first wiring substrate 12. In the following, in FIG. 3B, respective terminals are depicted on the left side of the wiring substrate. A branch signal line 40a branched from the signal line 40 and connected to the second wiring substrate 22 is provided to the first wiring substrate 12.

A power supply line 50 is provided to the first wiring substrate 12, and then a power supply terminal T2 connected to the power supply line 50 is provided on the lower surface of the first wiring substrate 12. Also, the power supply line 50 is connected to a power supply pad 14a of the first semiconductor chip 14, and also is connected to the first protection diode D1 of the first semiconductor chip 14. Actually, the power supply line 50 is connected to the first protection diode D1 via a connection pad (not shown) of the first semiconductor chip 14.

In this manner, the first protection diode D1 of the first semiconductor chip 14 is connected between the signal line 40 and the power supply line 50.

Also, a ground line 60 is provided to the first wiring substrate 12, and then a ground terminal T3 connected to the ground line 60 is provided on the lower surface of the first wiring substrate 12. Also, the ground line 60 is connected to a ground pad 14b of the first semiconductor chip 14, and also is connected to the second protection diode D2 of the first semiconductor chip 14. Actually, the ground line 60 is connected to the second protection diode D2 via a connection pad (not shown) of the first semiconductor chip 14.

In this manner, the second protection diode D2 of the first semiconductor chip 14 is connected between the signal line 40 and the ground line 60.

As in the related art, when a plus (+) overvoltage is supplied to the signal line 40 due to the influence of static electricity, a forward bias is supplied to the first protection diode D1 connected to the power supply line 50, and thus the static electricity is discharged to the power supply terminal T2. Also, when a minus (−) overvoltage is supplied to the signal line 40, a forward bias is supplied to the second protection diode D2, and thus the static electricity is discharged at the ground terminal T3.

In this way, on account of the functions of the first and second protection diodes D1, D2, the transistor circuit TC of the first semiconductor chip 14 can be protected from the breakdown caused due to a high voltage.

Also, in the second semiconductor device 20, similarly the transistor circuit TC (internal circuit) and both the first and second protection diodes D1, D2 connected to the transistor circuit TC are built in the second semiconductor chip 24.

A signal line 42 in the second wiring substrate is connected to the transistor circuit TC, and then the signal terminal T1X (connection portion) connected to the signal line 42 is provided on the lower surface of the second wiring substrate 22. The signal terminal T1X of the second wiring substrate 22 is connected to the branch signal line 40a branched from the signal line 40 of the first wiring substrate 12.

Accordingly, the signal terminal T1 of the first semiconductor device 10 is connected to the signal line 40 and the branch signal line 40a of the first wiring substrate 12, and the transistor circuit TC of the second semiconductor chip 24 via the signal terminal T1X and the signal line 42 of the second wiring substrate 22 (see a route indicated with a broken line).

A power supply line 52 is provided in the second wiring substrate 22, and then the power supply terminal T2Y (connection portion) connected to the power supply line 52 is provided on the lower surface of the second wiring substrate 22. The power supply line 52 of the second wiring substrate is connected to a power supply pad 24a of the second semiconductor chip 24, and also is connected to the first protection diode D1 of the second semiconductor chip 24. The power supply terminal T2Y of the second wiring substrate 22 is connected to the power supply line 50 in the first wiring substrate 12 (see a route indicated with a broken line).

In this manner, the first protection diode D1 of the second semiconductor chip 24 is connected between the signal line 42 and the power supply line 52 of the second wiring substrate 22.

Also, a ground line 62 is provided in the second wiring substrate 22, and then the ground terminal T3Y (connection portion) connected to the ground line 62 is provided on the lower surface of the second wiring substrate 22. The ground line 62 is connected to a ground pad 24b of the second semiconductor chip 24, and also is connected to the second protection diode D2 of the second semiconductor chip 24. Then, the ground terminal T3Y of the second wiring substrate 22 is connected to the ground line 60 of the first wiring substrate 12.

In this way, the second protection diode D2 of the second semiconductor chip 24 is connected between the signal line 42 and the ground line 62 of the second wiring substrate 22.

Also in the second semiconductor device 20, on account of the functions of the first and second protection diodes D1, D2, the transistor circuit TC of the second semiconductor chip 24 can be protected from the breakdown caused due to a high voltage.

As described above, in the stacked semiconductor device 1 of the present embodiment, a power is supplied to the first semiconductor chip 14 from the power supply line 50 provided to the first wiring substrate 12, and also a power is supplied to the second semiconductor chip 24 from the power supply line 52, which is connected to the power supply line 50 of the first wiring substrate 12, of the second wiring substrate 22.

Also, the ground line 60 provided to the first wiring substrate 12 is connected to the first semiconductor chip 14, and also the ground line 62, which is connected to the ground line 60 of the first wiring substrate 12, of the second wiring substrate 22 is connected to the second semiconductor chip 24.

That is, the power supply lines 50, 52 and the ground lines 60, 62 connected to the first and second semiconductor chips 14, 24 are used in common.

Also, in the present embodiment, the forward ON voltage of the first and second protection diodes D1, D2 of the first semiconductor chip 14 is set higher than the forward ON voltage of the first and second protection diodes D1, D2 of the second semiconductor chip 24.

Consequently, as described later, even when the power supply lines of the first and second semiconductor chips 14, 24 are used in common, it can be detected precisely in the connection test of the connection portions whether the electrical connection of the connection portions is normal, open, or electrically short.

For example, the forward ON voltage of the first and second protection diodes D1, D2 of the first semiconductor chip 14 is set to 0.6 V, and the forward ON voltage of the first and second protection diodes D1, D2 of the second semiconductor chip 24 is set to 0.45 V.

Next, a method of a connection test in the stacked semiconductor device according to the present embodiment will be explained hereunder. As also shown in FIG. 3B, first, an open/short tester (not shown) equipped with a constant-current source and a voltmeter 72 is prepared. Then, the constant-current source 70 and the voltmeter 72 are connected to the signal terminal T1 provided to the first wiring substrate 12.

Then, a constant electric current of +(plus) 100 μA is supplied from the constant-current source 70 to the signal line 40. At this time, the first semiconductor chip 14 and the second semiconductor chip 24 are connected to the power supply lines 50, which are used in common, and the power supply lines 50, 52 are grounded.

Therefore, in the first semiconductor device 10, an electric current flows toward the power supply line 50 side from the signal line 40 via the first protection diode D1 of the first semiconductor chip (see a route indicated with a broken line).

At the same time, in the second semiconductor device 20, the constant electric current flows from the signal line 40 and the branch signal line 40a of the first wiring substrate 12 to the signal terminal T1X and the signal line 42 of the second wiring substrate 22 (see a route indicated with a broken line).

Then, the constant electric current flows toward the power supply line 52 side from the signal line 42 of the second wiring substrate 22 via the first protection diode D1 of the second semiconductor chip 24 (see a route indicated with a broken line). Then, the constant electric current flows toward the power supply line 50 side of the first wiring substrate 12 from the power supply terminal T2Y of the second wiring substrate 22 (see a route indicated with a broken line).

At first, the case where the electrical connection between the signal terminal T1X of the second wiring substrate 22 and the first wiring substrate 12 is normal will be explained hereunder. In the case that the electrical connection is normal, the forward ON voltage (0.45 V) of the first protection diode D1 of the second semiconductor chip 24 can be detected from the voltmeter 72.

At this time, an electric current also flows from the signal line 40 of the first wiring substrate 12 to the first protection diode D1 of the first semiconductor chip 14. However, the forward ON voltage (0.6 V) of the first protection diode D1 of the first semiconductor chip 14 is set higher than the forward ON voltage (0.45 V) of the first protection diode D1 of the second semiconductor chip 24. Therefore, the forward ON voltage (0.6 V) of the first protection diode D1 of the first semiconductor chip 14 cannot be detected.

Further, at this time, the connection between the power supply terminal T2Y of the second wiring substrate 22 and the first wiring substrate 12 is also contained in the electrical route. Therefore, it is understood simultaneously that the electrical connection between the power supply terminal T2Y of the second wiring substrate 22 and the first wiring substrate 12 is normal.

That is, in the case that the forward ON voltage (0.45 V) of the first protection diode D1 of the second semiconductor chip 24 can be detected, it is understood simultaneously that respective electrical connections between the signal terminal T1X and the power supply terminal T2Y of the second wiring substrate 22, and the first wiring substrate 12 are normal.

Next, the case where the electrical connection between the signal terminal T1X of the second wiring substrate 22 and the first wiring substrate 12 is open will be explained hereunder. In the case that the electrical connection is open, the constant electric current does not flow from the signal line and the branch signal line 40a of the first wiring substrate 12 to the signal terminal T1X side of the second wiring substrate 22.

However, an electric current flows through the first protection diode D1 of the first semiconductor chip 14 of the first semiconductor device 10. Therefore, the forward ON voltage (0.6 V) of the first protection diode D1 of the first semiconductor chip 14 can be detected from the voltmeter 72. As a result, the event that the electrical connection is open can be specified.

In this case, as described above, respective electrical connections between the signal terminal T1X and the power supply terminal T2Y of the second wiring substrate 22, and the first wiring substrate 12 are tested simultaneously. Therefore, it is appreciated that an open fault occurs at least one out of the signal terminal T1X and the power supply terminal T2Y of the second wiring substrate 22.

In this way, in the present embodiment, the forward ON voltage of the first protection diode D1 of the first semiconductor chip 14 is set higher than the forward ON voltage of the first protection diode D1 of the second semiconductor chip 24. Therefore, even when the power supplies of the first and second semiconductor chips 14, 24 are used in common, it can be detected precisely whether the electrical connection is normal or open.

Also, in the case that the signal terminal T1X of the second wiring substrate 22 is electrically short with other terminal, the electric voltage of 0 V can be detected from the voltmeter 72. Therefore, in addition to normal or open, an occurrence of electrical short can be detected precisely.

Figure 4:
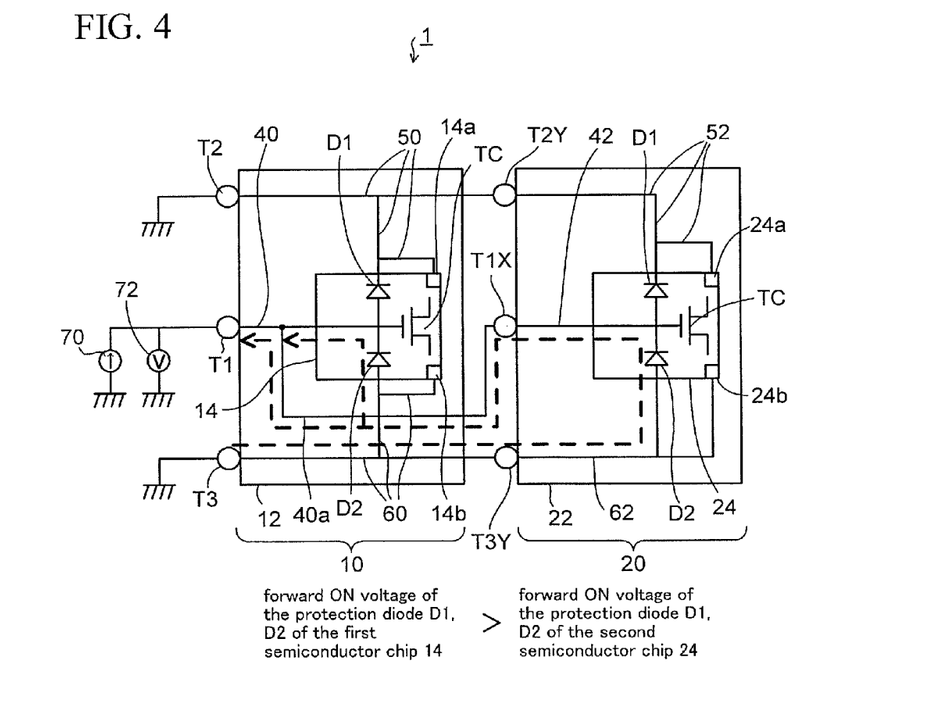
FIG. 4 is a view (#2) showing the equivalent circuit to explain the method of a connection test in the stacked semiconductor device according to the embodiment of the present invention.

Next, a method of a connection test between the ground terminal T3Y of the second wiring substrate and the first wiring substrate 12 will be explained with reference to FIG. 4 hereunder. As shown in FIG. 4, the constant electric current of − (minus) 100 µA is supplied from the signal terminal T1 of the first wiring substrate 12 to the signal line 40. At this time, the first semiconductor chip and the second semiconductor chip 24 are connected to the ground lines 60, 62 which are used in common, and also the ground lines 60, 62 are grounded.

In the cased that respective electrical connections between the ground terminal T3Y and the signal terminal T1X of the second wiring substrate 22, and the first wiring substrate 12 are normal, the constant electric current flows back toward the respective ground lines 60, 62 of the first and second wiring substrates 12, 22, the second protection diode D2 of the second semiconductor chip 24, and the signal line 42 side of the second wiring substrate 22 (see a route indicated with a broken line). Then, the constant electric current flows back toward the branch signal line 40a and the signal line 40 side of the first wiring substrate 12 (see a route indicated with a broken line).

Accordingly, the forward ON voltage (0.45 V) of the second protection diode D2 of the second semiconductor chip 24 can be detected from the voltmeter 72. As a result, it can be understood that both electrical connections of the ground terminal T3Y and the signal terminal T1X of the second wiring substrate 22 are normal.

Also, in the case that the electrical connection is open, the constant electric current does not flow back toward the second protection diode D2 of the second semiconductor chip 24, but the constant electric current flows back toward the signal line 40 from the ground line 60 of the first wiring substrate 12 via the second protection diode D2 of the first semiconductor chip 14 (see a route indicated with a broken line). As a result, the forward ON voltage (0.6 V) of the second protection diode D2 of the first semiconductor chip 14 can be detected from the voltmeter 72.

Accordingly, it is understood that the electrical connection of at least one out of the ground terminal T3Y and the signal terminal T1X of the second wiring substrate 22 is open. In the case that it is confirmed in advance that the electrical connection of the signal terminal T1X of the second wiring substrate 22 is normal, such a situation can be specified that the ground terminal T3Y of the second wiring substrate 22 is open.

Otherwise, in the case that the ground terminal T3Y of the second wiring substrate 22 is electrically short with other terminal, 0 V can be detected from the voltmeter 72.

In this fashion, the constant electric current is sequentially supplied to a large number of terminals T of the first wiring substrate 12, and then the forward ON voltage (e.g., 0.6 V) of the protection diode (D1 or D2) of the first semiconductor chip 14 or the forward ON voltage (e.g., 0.45 V) of the protection diode (D1 or D2) of the second semiconductor chip 24 is detected. Otherwise, in the case that electrical short is occurring, 0 V can be detected.

As a result, it is judged sequentially whether the electrical connection of each connection portion is normal, open, or electrically short. In the case that the connection portion is open or electrically short, the stacked semiconductor device is rejected as the defective product.

As explained above, in the stacked semiconductor device 1 of the present embodiment, the power supply lines are used in common, and also the forward ON voltage of the first and second protection diodes D1, D2 of the first semiconductor chip 14 is set higher than the forward ON voltage of the first and second protection diodes D1, D2 of the second semiconductor chip 24. Accordingly, it can be detected precisely whether the electrical connection is normal, open, or electrically short. As a result, high reliability can be achieved in the connection test in the stacked semiconductor device.

What is claimed is:

1. A stacked semiconductor device, comprising:
   a first semiconductor device including
      a signal line,
      a power supply line,
      a ground line, and
      a first semiconductor chip having a transistor circuit connected to the signal line, a first protection diode connected between the signal line and the power supply line, and a second protection diode connected between the signal line and the ground line; and
   a second semiconductor device including
      a signal line,
      a power supply line,
      a ground line, and
      a second semiconductor chip having a transistor circuit connected to the signal line, a first protection diode connected between the signal line and the power supply line, and a second protection diode connected between the signal line and the ground line, wherein
      the second semiconductor device is stacked on the first semiconductor device via a connection portion such that each of the signal line, the power supply line, and the ground line is connected respectively,
   wherein the power supply line connected to the first and second semiconductor chips is used in common, and
   a forward ON voltage of the first and second protection diodes of the first semiconductor chip is set higher than a forward ON voltage of the first and second protection diodes of the second semiconductor chip.

2. A method of a connection test in a stacked semiconductor device,
   the stacked semiconductor device comprising:
      a first semiconductor device including
         a signal line,
         a power supply line, a ground line, and a first semiconductor chip having a transistor circuit connected to the signal line, a first protection diode connected between the signal line and the power supply line, and a second protection diode connected between the signal line and the ground line, and a second semiconductor device including a signal line, a power supply line, a ground line, and a second semiconductor chip having a transistor circuit connected to the signal line, a first protection diode connected between the signal line and the power supply line, and a second protection diode connected between the signal line and the ground line, wherein the second semiconductor device is stacked on the first semiconductor device via a connection portion such that each of the signal line, the power supply line, and the ground line is connected respectively, and in which the power supply line connected to the first and second semiconductor chips is used in common, and a forward ON voltage of the first and second protection diodes of the first semiconductor chip is set higher than a forward ON voltage of the first and second protection diodes of the second semiconductor chip; and the method of the connection test includes, supplying a constant electric current to the signal line, then when an electrical connection of the connection portion is normal, the forward ON voltage of the first protection diode or the second protection diode of the second semiconductor chip is detected, otherwise, when the electrical connection of the connection portion is open, the forward ON voltage of the first protection diode or the second protection diode of the first semiconductor chip is detected.

3. A method of a connection test in a stacked semiconductor device according to claim 2, wherein the power supply line is ground, and the method of the connection test includes, supplying a plus constant electric current to the signal line, then when the electrical connection of each of connection portions of the signal line and the power supply line is normal, the forward ON voltage of the first protection diode of the second semiconductor chip is detected, otherwise, when the electrical connection in the connection portion of at least one of the signal line and the power supply line is open, the forward ON voltage of the first protection diode of the first semiconductor chip is detected.

4. A method of a connection test in a stacked semiconductor device according to claim 2, wherein the ground line is ground, and the method of the connection test includes, supplying a minus constant electric current to the signal line, then when the electrical connection of each of connection portions of the ground line and the signal line is normal, the forward ON voltage of the second protection diode of the second semiconductor chip is detected, otherwise, when the electrical connection of the connection portion of at least one of the signal line and the ground line is open, the forward ON voltage of the second protection diode of the first semiconductor chip is detected.

5. A method of a connection test in a stacked semiconductor device according to claim 3, wherein, when the connection portion is electrically short with other connection portion, a voltage of 0 V is detected.

6. A method of a connection test in a stacked semiconductor device according to claim 4, wherein, when the connection portion is electrically short with other connection portion, a voltage of 0 V is detected.

* * * * *